United States Patent
Ohshima

(10) Patent No.: US 9,960,116 B2
(45) Date of Patent: May 1, 2018

(54) SEMICONDUCTOR DEVICE AND MANUFACTURING METHOD THEREOF

(75) Inventor: Kazuaki Ohshima, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days. days.

(21) Appl. No.: 12/563,608

(22) Filed: Sep. 21, 2009

(65) Prior Publication Data

US 2010/0072574 A1   Mar. 25, 2010

(30) Foreign Application Priority Data

Sep. 25, 2008   (JP) ................................ 2008-245124

(51) Int. Cl.
| | |
|---|---|
| *H01L 29/86* | (2006.01) |
| *H01L 23/522* | (2006.01) |
| *H01C 1/16* | (2006.01) |
| *H01C 13/02* | (2006.01) |
| *H01L 23/525* | (2006.01) |
| *H01L 49/02* | (2006.01) |

(52) U.S. Cl.
CPC ........... *H01L 23/5228* (2013.01); *H01C 1/16* (2013.01); *H01C 13/02* (2013.01); *H01L 23/5258* (2013.01); *H01L 28/20* (2013.01); *H01L 28/24* (2013.01); *H01L 2924/0002* (2013.01); *H01L 2924/12044* (2013.01)

(58) Field of Classification Search
CPC .......... H01C 1/16; H01C 13/02; H01C 17/22; H01C 17/24; H01C 17/242; H01L 23/5228; H01L 23/5258; H01L 23/528; H01L 2924/1207

USPC ....................................... 438/382, 384, 385
See application file for complete search history.

(56) References Cited

U.S. PATENT DOCUMENTS 3,592,708 A * 7/1971 Collins et al. .......... H01L 43/08
                                                          257/425
3,930,896 A * 1/1976 Takahama et al. ............ 428/432
4,042,479 A * 8/1977 Yamazaki et al. ....... 204/192.21
(Continued)

FOREIGN PATENT DOCUMENTS

EP   0 157 446 A1 * 10/1985
JP   51-151572 A     12/1976
(Continued)

OTHER PUBLICATIONS

Wolf et al., "Silicon Processing for the VLSI Era, vol. 1—Process Technology", Sunset Beach, CA: Lattice Press, 1986, pp. 296-299.*

(Continued)

*Primary Examiner* — Mary Wilczewski
(74) *Attorney, Agent, or Firm* — Husch Blackwell LLP

(57) ABSTRACT

A resistor whose characteristic value can be changed without requiring a photolithography process again is provided. The resistor includes a plurality of first resistor units which is connected serially to each other and a second resistor unit which is connected in parallel to part of the first resistor units. Then, after the measurement of a semiconductor integrated circuit, the second resistor unit is electrically disconnected as necessary. The first resistor units may be either a unit including a single resistor or may be a unit including a plurality of resistors.

9 Claims, 7 Drawing Sheets

(56) References Cited

U.S. PATENT DOCUMENTS

| | | | |
|---|---|---|---|
| 4,189,739 A * | 2/1980 | Copeland, III | H01L 27/0255 257/363 |
| 4,228,418 A * | 10/1980 | Piedmont | H01C 17/23 338/195 |
| 4,283,774 A * | 8/1981 | Schwartz | G11C 19/0866 338/195 |
| 4,301,439 A * | 11/1981 | Johnson | H01C 17/24 29/620 |
| 4,329,878 A | 5/1982 | Utner et al. | |
| 4,334,198 A | 6/1982 | Malchow | |
| 4,386,460 A * | 6/1983 | Klockow | H01C 17/23 29/593 |
| 4,620,212 A | 10/1986 | Ogasawara | |
| 4,686,487 A | 8/1987 | Radovsky | |
| 4,725,876 A * | 2/1988 | Kishi | 257/541 |
| 4,791,379 A | 12/1988 | Hughes | |
| 4,906,966 A * | 3/1990 | Imamura | H01C 17/23 219/121.68 |
| 5,065,221 A * | 11/1991 | Imamura | H01C 17/23 219/121.68 |
| 5,138,425 A | 8/1992 | Ichikawa | |
| 5,187,559 A * | 2/1993 | Isobe | H01L 28/20 257/538 |
| 5,241,207 A | 8/1993 | Toyoshima et al. | |
| 5,352,923 A * | 10/1994 | Boyd | H01L 28/20 257/379 |
| 5,416,438 A | 5/1995 | Shibata | |
| 5,469,092 A | 11/1995 | Itakura | |
| 5,493,148 A * | 2/1996 | Ohata et al. | 257/538 |
| 5,569,936 A | 10/1996 | Zhang et al. | |
| 5,936,231 A | 8/1999 | Michiyama et al. | |
| 5,977,759 A | 11/1999 | Sitch | |
| 6,013,940 A * | 1/2000 | Harada et al. | 257/538 |
| 6,084,502 A * | 7/2000 | Ariga et al. | 338/195 |
| 6,229,428 B1 * | 5/2001 | Lai | H01C 10/18 338/195 |
| 6,255,897 B1 | 7/2001 | Klemmer | |
| 6,262,915 B1 * | 7/2001 | Kihara | G06F 17/30067 365/185.11 |
| 6,287,888 B1 | 9/2001 | Sakakura et al. | |
| 6,316,971 B1 | 11/2001 | Ohashi | |
| 6,351,078 B1 * | 2/2002 | Wang | G09G 3/3233 313/498 |
| 6,358,767 B2 | 3/2002 | Eguchi | |
| 6,531,711 B2 | 3/2003 | Sakakura et al. | |
| 6,566,904 B2 | 5/2003 | van Bavel et al. | |
| 6,628,223 B2 | 9/2003 | Nagano | |
| 6,664,500 B2 * | 12/2003 | Wilbur | H01C 17/242 219/121.68 |
| 6,777,754 B2 * | 8/2004 | Shiiki | H01L 21/84 257/358 |
| 6,876,233 B1 | 4/2005 | Bernardson | |
| 6,911,358 B2 | 6/2005 | Azami et al. | |
| 6,927,600 B2 | 8/2005 | Choe | |
| 6,930,326 B2 | 8/2005 | Kato et al. | |
| 7,030,551 B2 | 4/2006 | Yamazaki et al. | |
| 7,034,653 B2 * | 4/2006 | Bhattacharya et al. | 338/322 |
| 7,042,432 B2 | 5/2006 | Yamazaki et al. | |
| 7,068,552 B2 | 6/2006 | Kawasumi | |
| 7,193,619 B2 | 3/2007 | Kimura | |
| 7,205,880 B2 * | 4/2007 | Fukunaga | 338/195 |
| 7,253,391 B2 | 8/2007 | Koyama et al. | |
| 7,312,473 B2 | 12/2007 | Koyama et al. | |
| 7,391,082 B2 * | 6/2008 | Shin et al. | 257/351 |
| 7,495,272 B2 | 2/2009 | Maruyama et al. | |
| 7,602,044 B2 * | 10/2009 | Harada | H01L 27/0802 257/541 |
| 7,615,844 B2 * | 11/2009 | Watanabe | 257/536 |
| 7,667,272 B2 | 2/2010 | Hirose | |
| 7,741,687 B2 | 6/2010 | Yamaguchi et al. | |
| 7,764,109 B2 | 7/2010 | Goto | |
| 7,888,714 B2 | 2/2011 | Takahashi et al. | |
| 7,932,126 B2 | 4/2011 | Maruyama et al. | |
| 8,153,511 B2 | 4/2012 | Yamada et al. | |
| 8,174,053 B2 * | 5/2012 | Kitakado | H01L 29/78603 257/213 |
| 8,242,580 B2 * | 8/2012 | Tsukamoto | H01L 28/20 257/380 |
| 8,604,589 B2 * | 12/2013 | Tsukamoto | H01L 28/20 257/380 |
| 2002/0000631 A1 | 1/2002 | Sakakura et al. | |
| 2002/0044208 A1 | 4/2002 | Yamazaki et al. | |
| 2003/0230750 A1 | 12/2003 | Koyama et al. | |
| 2004/0042707 A1 | 3/2004 | Imai et al. | |
| 2004/0201056 A1 * | 10/2004 | Miyata | H01C 7/006 257/303 |
| 2005/0077925 A1 | 4/2005 | Bernardson | |
| 2005/0082463 A1 | 4/2005 | Koyama et al. | |
| 2005/0116301 A1 * | 6/2005 | Shaw | H01L 28/20 257/380 |
| 2005/0167573 A1 | 8/2005 | Maruyama et al. | |
| 2006/0186497 A1 | 8/2006 | Nishi et al. | |
| 2006/0214235 A1 * | 9/2006 | Harada | 257/363 |
| 2008/0248601 A1 | 10/2008 | Tsukamoto et al. | |
| 2009/0117681 A1 | 5/2009 | Maruyama et al. | |
| 2010/0096736 A1 | 4/2010 | Tadokoro et al. | |
| 2010/0140456 A1 | 6/2010 | Hirose | |

FOREIGN PATENT DOCUMENTS

| | | |
|---|---|---|
| JP | 57-032663 A | 2/1982 |
| JP | 60-060752 A | 4/1985 |
| JP | 60-219703 | 11/1985 |
| JP | 62-219653 A | 9/1987 |
| JP | 63-077143 A | 4/1988 |
| JP | 63-143857 A | 6/1988 |
| JP | 63-310160 | 12/1988 |
| JP | 2-117168 | 5/1990 |
| JP | 02-307260 A | 12/1990 |
| JP | 05-055470 A | 3/1993 |
| JP | 05-094968 A | 4/1993 |
| JP | 407019473 A * | 1/1995 |
| JP | 09-232118 A | 9/1997 |
| JP | 09-289323 A | 11/1997 |
| JP | 11-251529 | 9/1999 |
| JP | 2001-10264 | 1/2001 |
| JP | 2001-298337 | 10/2001 |
| JP | 2001-298337 A | 10/2001 |
| JP | 2005-101227 A | 4/2005 |
| JP | 2005-158936 A | 6/2005 |
| JP | 2005-340377 A | 12/2005 |
| JP | 2006-040917 A | 2/2006 |
| JP | 2006-324402 A | 11/2006 |
| JP | 2007-48183 | 2/2007 |
| JP | 2009-206122 | 9/2009 |
| JP | 2009-206122 A | 9/2009 |

OTHER PUBLICATIONS

PCT Invitation to Pay Additional Fees re application No. PCT/JP2009/065128, dated Sep. 29, 2009.

* cited by examiner

SEMICONDUCTOR DEVICE AND MANUFACTURING METHOD THEREOF

TECHNICAL FIELD

The present invention relates to a resistor and a manufacturing method thereof, a semiconductor device and a manufacturing method thereof, and the like.

BACKGROUND ART

A semiconductor device provided with a semiconductor integrated circuit includes a switching element such as a TFT, a capacitor, a resistor, and the like.

The characteristic values of a switching element, a capacitor, and a resistor are determined when they are designed, and usually cannot be changed after the semiconductor integrated circuit is completed.

In view of the above, a technique is disclosed by which a spare element group formed in advance is used for modifying the characteristics of a semiconductor integrated circuit in accordance with the evaluation on the characteristics (Patent Document 1).
[Patent Document 1] Japanese Published Patent Application No. 11-251529

DISCLOSURE OF INVENTION

According to the technique disclosed in Patent Document 1, masks for wirings and contact holes which connect the integrated circuit to the spare element group are designed in accordance with the results of the characteristic evaluation. This is complicated because a photolithography process is necessary again after the circuit is completed.

Accordingly, an object of an embodiment of the present invention is to provide a resistor whose characteristic values can be changed without requiring a photolithography process again after the circuit is completed.

First, a plurality of resistor units (first resistor units) is serially connected to each other.

Note that the resistor unit may be either a unit including a single resistor or a unit including a plurality of resistors (for example, a structure in which a plurality of resistors is connected in parallel to each other.)

A second resistor unit is provided so as to be connected in parallel to part of the plurality of resistor units.

Note that the second resistor unit has a lower resistance value than the first resistor unit. Then, after the measurement of the semiconductor integrated circuit, the second resistor unit may be electrically disconnected from the part of the first resistor units as necessary.

Note that a circuit such as a switching element, a capacitor, and a resistor may be formed to be electrically connected to the first resistor units. After evaluating a resistance value of the circuit, it is determined whether to disconnect the second resistor unit from the part of the first resistor units depending on the evaluated resistance value of the circuit.

According to another embodiment of the present invention, the first resistor unit includes a plurality of resistors. Then, part of wirings or part of the resistors in the first resistor unit may be electrically disconnected.

According to an embodiment of the present invention to be disclosed, a semiconductor device includes a plurality of first resistor units which are serially connected to each other, and a second resistor unit which is connected in parallel to part of the plurality of first resistor units, wherein the second resistor unit has a lower resistance value than the first resistor unit.

According to another embodiment of the present invention to be disclosed, a method for manufacturing a semiconductor device includes forming a plurality of first resistor units which are serially connected to each other and a second resistor unit which is connected in parallel to part of the plurality of first resistor units and which has a lower resistance value than the first resistor unit, and then electrically disconnecting the second resistor unit.

The first resistor units are preferably formed using a silicon layer and the second resistor unit is preferably formed using a metal layer.

According to another embodiment of the present invention to be disclosed, a method for manufacturing a semiconductor device includes forming a structure where a plurality of units in each of which a plurality of resistors is connected in parallel to each other using wirings is serially connected to each other, and electrically disconnecting part of the resistors or the wirings.

The characteristic values of the resistor according to an embodiment of the present invention to be disclosed can be changed without requiring a photolithography process again after the circuit is completed.

Note that there is no particular limitation on a method of the disconnection. However, laser cutting is preferable because the change in characteristics is possible even after sealing of elements.

BEST MODE FOR CARRYING OUT THE INVENTION

Figure 1A:
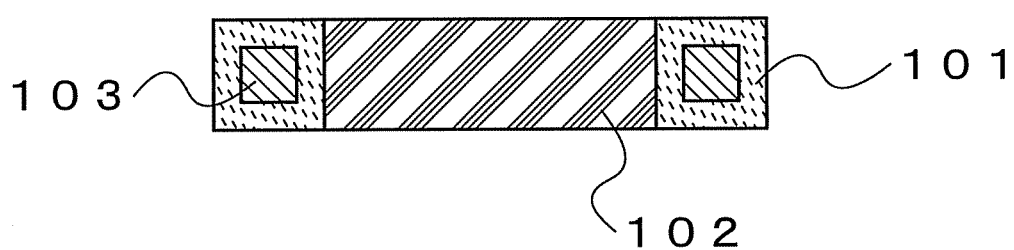
FIGS. 1A and 1B illustrate an example of a resistor.

Embodiments are described in detail with reference to drawings.

Note that it is easily understood by those skilled in the art that the present invention is not limited to the description below and various changes and modifications can be made without departing from the spirit and scope of the present invention.

Therefore, the present invention to be disclosed is not interpreted as being limited to the description of Embodiments below.

In the structures to be given below, the same portions or portions having similar functions are denoted by the same reference numerals in different drawings, and explanation thereof will not be repeated.

Embodiment 1

Figure 1B:
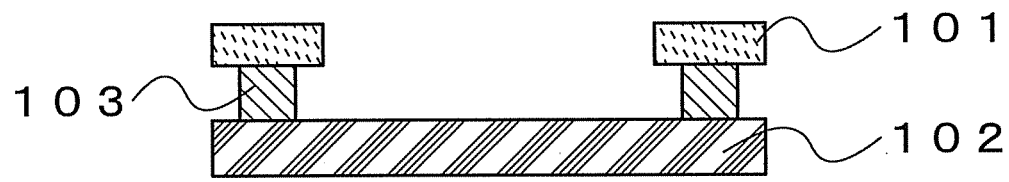

Embodiment 1 describes a structure of a resistor.
FIG. 1A is a top view of a resistor and FIG. 1B is a longitudinal sectional view thereof.

The resistor includes a metal layer 101 (a second conductive layer), a silicon layer 102 including amorphous silicon or polysilicon doped with an impurity (a first conductive layer), and a conductor 103 for connecting the metal layer 101 and the silicon layer 102 to each other.

The metal layer 101 can be formed from titanium, molybdenum, tungsten, aluminum, copper, silver, gold, nickel, platinum, palladium, iridium, rhodium, tantalum, cadmium, zinc, iron, or the like.

By setting as appropriate the condition of ion implantation, such as the kind, the amount, and the like of the impurity which is added to the silicon layer 102 of the resistor by doping, the resistor can have a desired resistance value.

As for the kind of impurity, in order to obtain silicon having n-type conductivity, an impurity including phosphorus, arsenic, or the like can be used; in order to obtain silicon having p-type conductivity, an impurity including boron or the like can be used.

The conductor 103 can be formed from a material similar to that of the metal layer 101. The metal layer 101 and the conductor 103 may be formed using the same film.

Note that in Embodiment 1, a silicon layer is used as the first conductive layer and metal is used for the second conductive layer. However, any other material may be used as long as the resistance value (or resistivity) of the second conductive layer is lower than that of the first conductive layer (in particular, needless to say, a semiconductor other than silicon may be used, such as silicon germanium or germanium.)

For example, a semiconductor layer may be used as each of the first conductive layer and the second conductive layer and the resistance values (or resistivity) thereof may be set so as to be different by using the first conductive layer which has lower crystallinity than the second conductive layer.

Note that the descending order of crystallinity is as follows: single crystal, polycrystal, microcrystal, and amorphous. As the crystallinity is lower, the resistance value (or resistivity) is higher.

Moreover, a semiconductor layer may be used as each of the first conductive layer and the second conductive layer and the resistance value (or resistivity) thereof may be set so as to be different by using the first conductive layer which has lower impurity concentration than the second conductive layer. Even in this case, the first conductive layer may have lower crystallinity than the second conductive layer.

Alternatively, metal may be used for each of the first conductive layer and the second conductive layer and the resistance value (or resistivity) thereof may be set to be different by nitriding or oxidizing the first conductive layer.

When a resistor including the first conductive layer and a resistor including the second conductive layer are connected in parallel to each other, the difference in resistance value (or resistivity) therebetween is preferably large to such a degree that the resistance of the resistor including the second conductive layer is ignorable.

When the second conductive layer has a much lower resistance value than the first conductive layer, the resistance value of the second conductive layer can be ignored. It can be said that the resistance value can be ignored when the resistivity of the first conductive layer is 100 times or more that of the second conductive layer. For example, doped silicon has a resistivity of (though depending on the amount of impurity added) about $10^1$ Ωm to $10^3$ Ωm and metal has a resistivity of about $10^{-8}$ Ωm to $10^{-7}$ Ωm. In consideration of this, it can be said that the resistance value can be sufficiently ignored when these are used in combination.

Since the resistivities of many substances are known, the skilled in the art can choose an optimum combination as appropriate.

From the viewpoint of after-adjustment of the resistance value, any mode can be applied as long as the second conductive layer has a lower resistance value than the first conductive layer. (This is because, even though the resistance value of the second conductive layer is not ignorable, the after-adjustment of the resistance value by disconnection is possible as long as there is a difference in resistance value between the first conductive layer and the second conductive layer.)

Figure 2A:
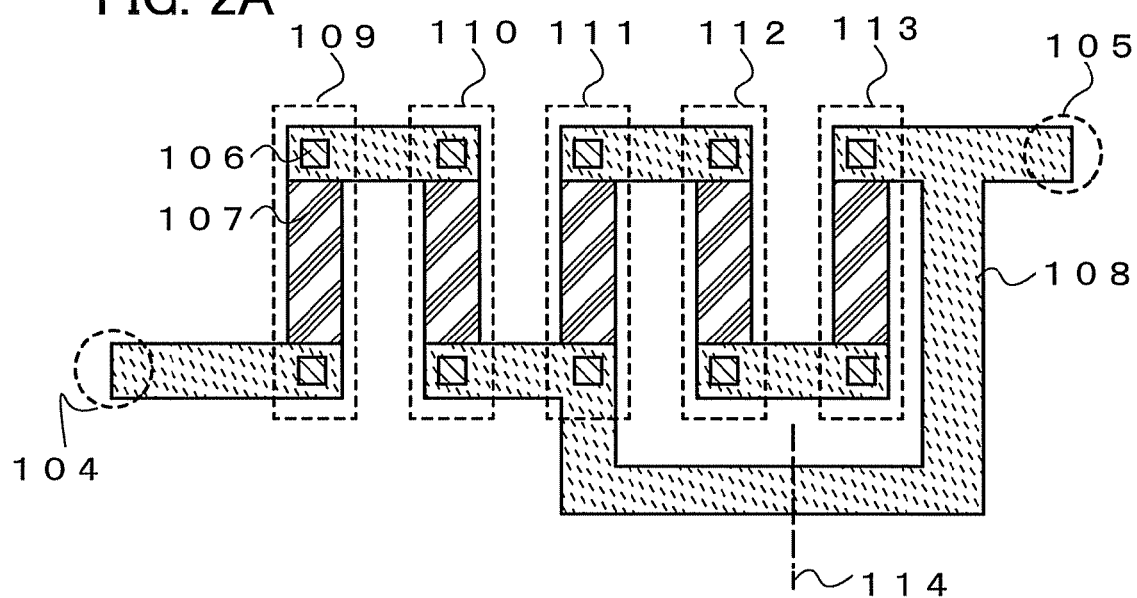
FIGS. 2A and 2B illustrate examples of a top view and a circuit diagram of resistors (before disconnection).

FIG. 2A illustrates a resistor group in which a resistor 109, a resistor 110, a resistor 111, a resistor 112, and a resistor 113 are connected to each other by a second resistor unit 108 and the resistor 111 is connected to an end point 105, so that a desired resistance value is obtained. Note that each of the resistors 109 to 113 includes a first resistor unit 107 and a conductor 106 which electrically connects a metal layer and the first resistor unit 107 to each other.

Therefore, since the resistor 111 and the end point 105 are connected to each other by the second resistor unit 108, the resistance value (or resistivity) of the resistor group of FIG. 2A from a start point 104 to the end point 105 corresponds to the sum of the resistance value (or resistivity) of the resistor 109 and that of the resistor 110.

That is to say, the serially-connected resistor group (the resistor 109, the resistor 110, the resistor 111, the resistor 112, and the resistor 113) is provided.

Moreover, at least one second resistor unit 108 connected in parallel to part of the serially-connected resistor group is provided. Note that each of the first and second resistor units includes a single resistor in Embodiment 1; however, each of the first and second resistor units may include resistors connected in parallel to each other.

As illustrated in FIG. 2A, a position 114 which will be irradiated with a laser beam after completion of manufacture of a semiconductor device should be prepared at the time of mask layout.

Figure 2B:
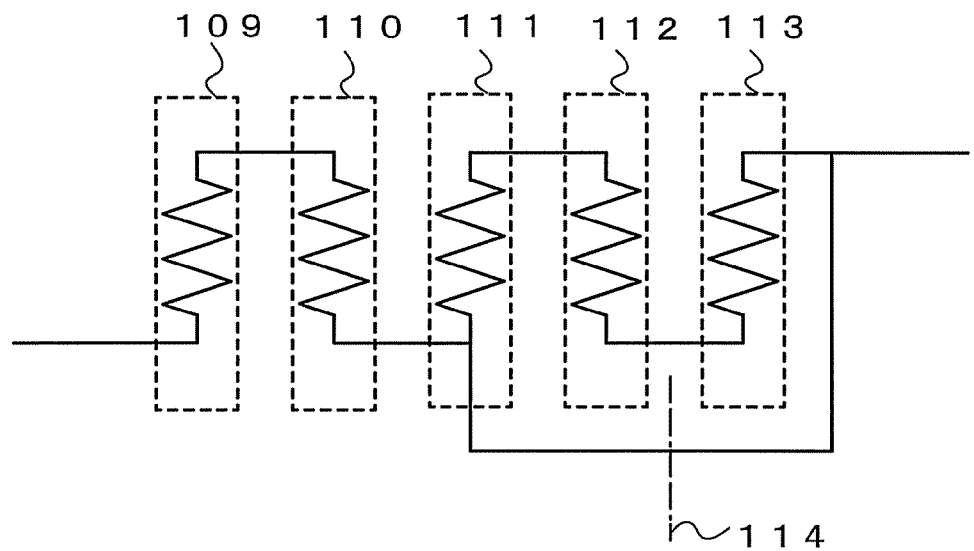

FIG. 2B is a circuit diagram of FIG. 2A.

The second resistor unit 108 has a much lower resistance value (or resistivity) than the first resistor unit 107 and is not regarded as a resistor.

The mask layout is designed as illustrated in FIG. 2A and a process for manufacturing a semiconductor device is performed.

In evaluation, inspection, and the like after the completion of manufacture of the semiconductor device, in some cases, the resistance value (or resistivity) is deviated from the value set in the mask layout due to variation in characteristics caused in a process for manufacturing the semiconductor device.

Figure 3A:
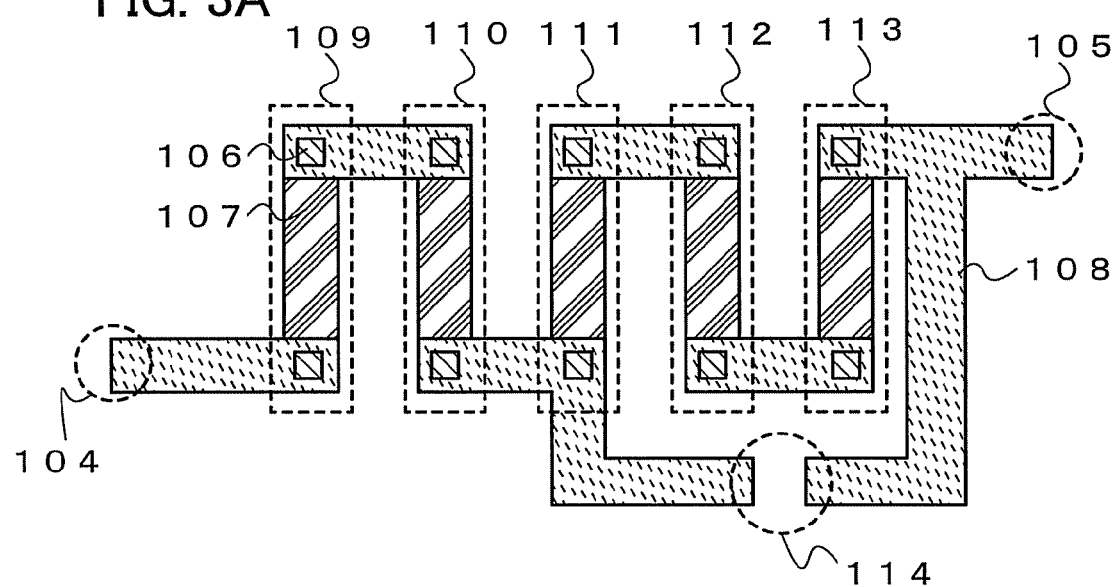
FIGS. 3A and 3B illustrate examples of a top view and a circuit diagram of resistors (after disconnection).

The position 114 which is irradiated with a laser beam on the second resistor unit 108 in FIG. 2A is irradiated with a laser beam for division; thus, a resistor group shown in FIG. 3A is obtained. In this case, after the completion of the process for manufacturing the semiconductor device, the resistance value (or resistivity) from the start point 104 to the end point 105 can be obtained by adding the resistance values (or resistivities) of the resistor 109, the resistor 110, the resistor 111, the resistor 112, and the resistor 113.

Figure 3B:
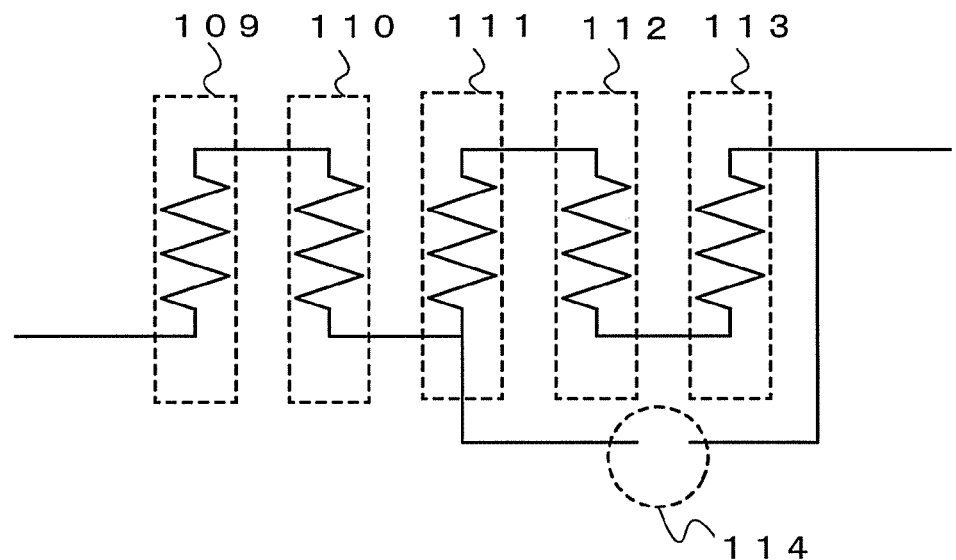

FIG. 3B is a circuit diagram of FIG. 3A.

Embodiment 2

Figure 4A:
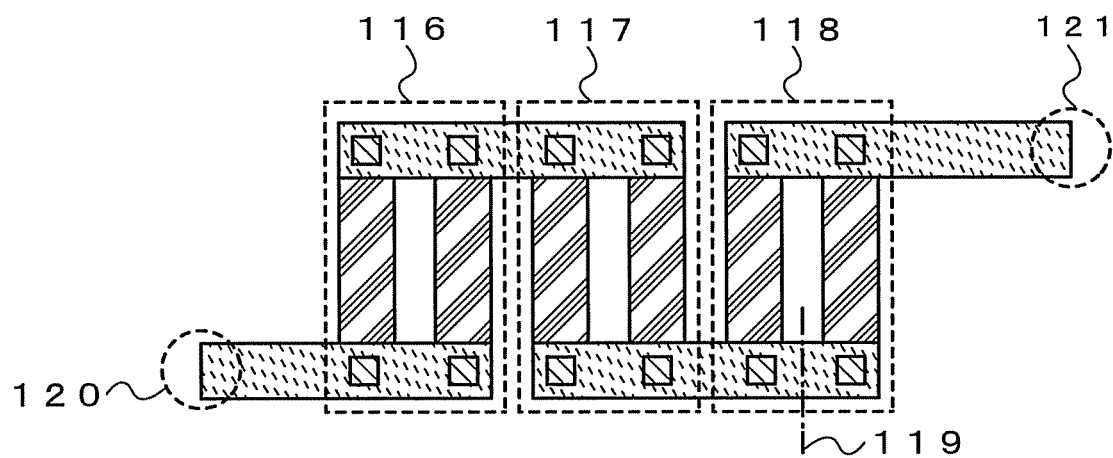
FIGS. 4A and 4B illustrate examples of a top view and a circuit diagram of resistors (before disconnection).

In FIG. 4A, a parallel resistor unit 116 includes resistors which are connected in parallel to each other, a parallel resistor unit 117 includes resistors which are connected in parallel to each other, and a parallel resistor unit 118 includes resistors which are connected in parallel to each other. The parallel resistor units 116, 117, and 118 are connected to each other with wirings to form a resistor element having a desired resistance value.

Figure 4B:
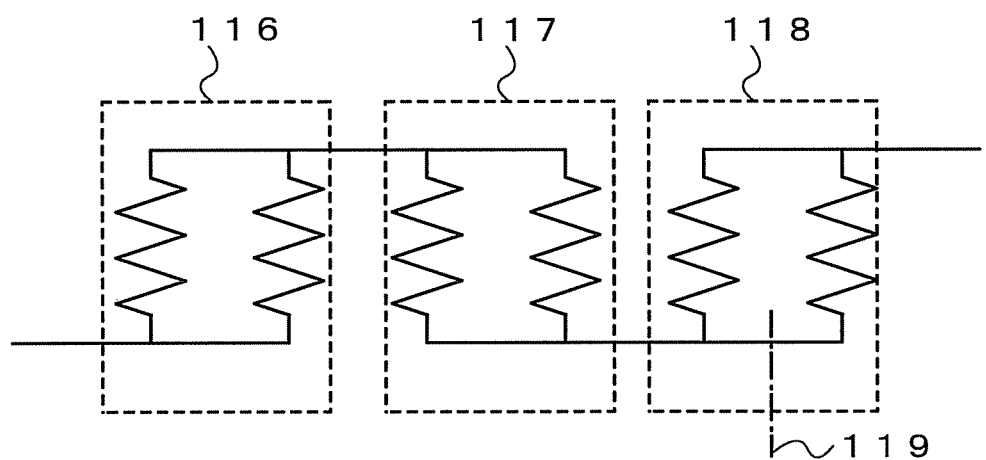

FIG. 4B is a circuit diagram of FIG. 4A.

Since the wiring has a much lower resistance value (or resistivity) than the resistor, the wiring is not regarded as a resistor.

The mask layout is designed as illustrated in FIG. 4A, and a process for manufacturing a semiconductor device is performed.

In evaluation, inspection, and the like after the completion of manufacture of the semiconductor device, in some cases, the resistance value (or resistivity) is deviated from the value set in the mask layout due to variation in characteristics caused in a process for manufacturing the semiconductor device.

Figure 5A:
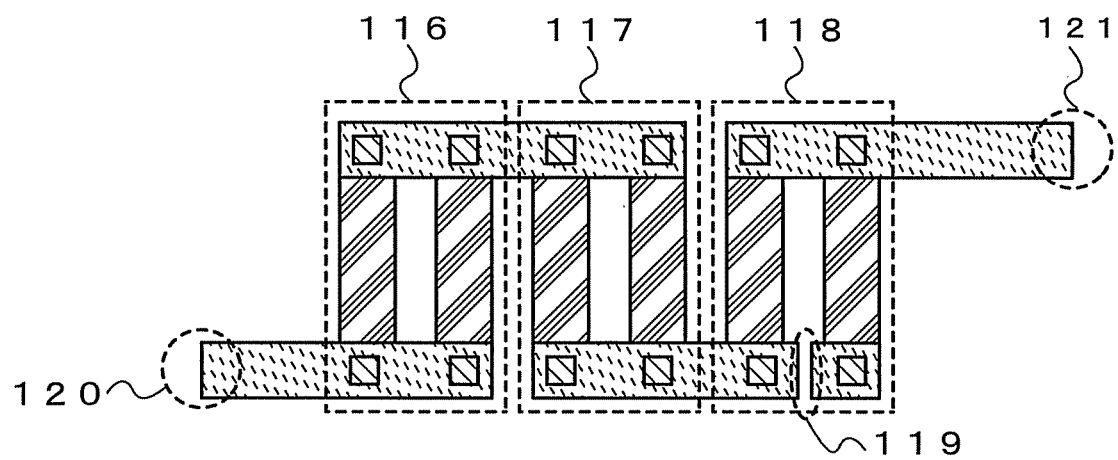
FIGS. 5A and 5B illustrate examples of a top view and a circuit diagram of resistors (after disconnection).

A position 119 which is irradiated with a laser beam on the metal wirings in FIG. 4A is irradiated with a laser beam for division; thus, a resistor group shown in FIG. 5A is obtained. In this case, after the completion of the process for manufacturing the semiconductor device, the resistance value (or resistivity) from a start point 120 to an end point 121 can be obtained by adding the resistance value (or resistivity) of the parallel resistor unit 116, the resistance value (or resistivity) of the parallel resistor unit 117, and the double of the resistance value (or resistivity) of the parallel resistor unit 118.

The position which will be irradiated with a laser beam is fixed in Embodiment 2; however, where to divide with the use of a laser beam is determined as appropriate and laser irradiation may be performed on the wiring so that a necessary resistance value is obtained.

Figure 5B:
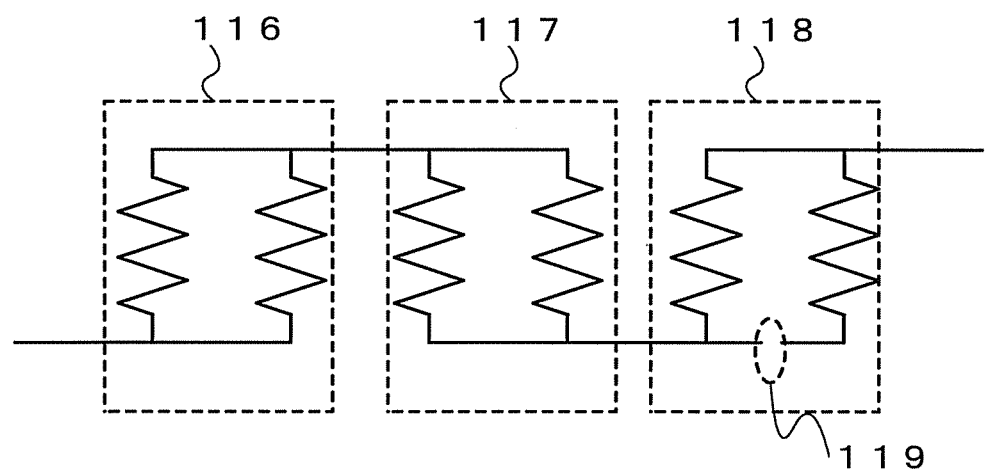

FIG. 5B is a circuit diagram of FIG. 5A.

Note that the metal layer is divided with the use of a laser beam in Embodiment 2; however, scissors, a cutter, a needle, or the like may be used for the division.

However, the use of scissors, a cutter, a needle, or the like might lead to destruction of circuits arranged around the resistors due to stress at the time of the division.

Further, if the division with scissors, a cutter, a needle, or the like is performed after sealing, the sealing state will be broken. Therefore, in such a case, the sealing becomes meaningless.

Accordingly, the division with the use of a laser beam is preferable because division can be performed without problems of stress destruction and sealing breakage.

Embodiment 3

Embodiment 3 describes an example of a semiconductor device including the resistor of Embodiment 1 or Embodiment 2.

Figure 6:
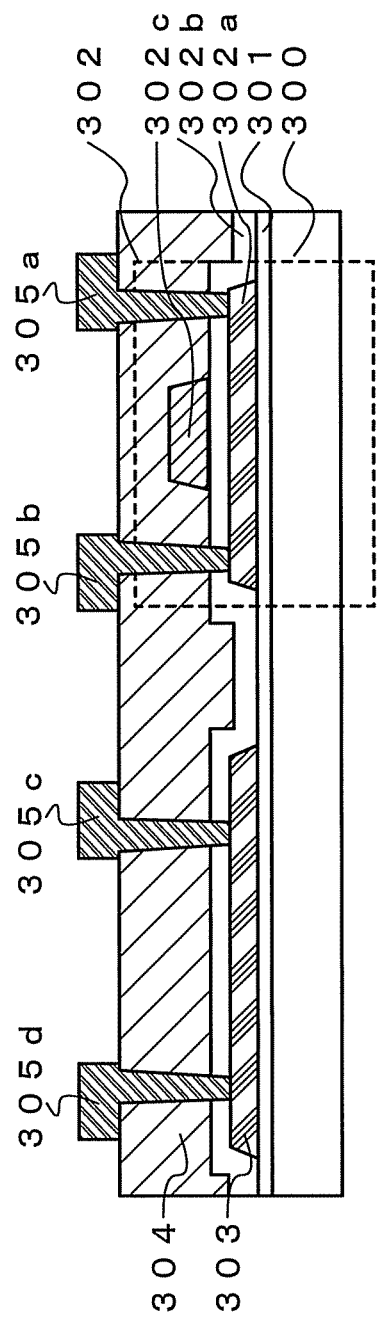
FIG. 6 illustrates an example of a semiconductor device.

FIG. 6 illustrates one of a plurality of thin film transistors and one of the resistors of Embodiment 1 or Embodiment 2.

The semiconductor device illustrated in FIG. 6 includes a thin film transistor 302 in which a base insulating film 301, a semiconductor layer 302a, a gate insulating film 302b, and a gate electrode 302c are stacked over a substrate 300 in that order; a layer 303 including a resistor; an interlayer insulating film 304; and wirings 305a to 305d.

The base insulating film 301 is provided over the substrate 300, the thin film transistor 302 and the layer 303 including a resistor are provided over the base insulating film 301, the interlayer insulating film 304 is provided over the thin film transistor 302 and the layer 303 including a resistor, and the wirings 305a to 305d are provided over the interlayer insulating film 304.

As the substrate 300, a glass substrate, a quartz substrate, a resin substrate, a metal substrate, or the like can be used.

In the case of division with the use of a laser beam, a substrate with a light-transmitting property such as a glass substrate, a quartz substrate, or a resin substrate is preferable because the division can be performed by delivering a laser beam from the substrate side.

For the base insulating film 301, a silicon oxide film, a silicon nitride film, a silicon oxide film including nitrogen, a silicon nitride film including oxygen, aluminum oxide, aluminum nitride, or the like can be used.

For the semiconductor layer 302a, silicon, silicon germanium, germanium, an organic semiconductor (such as pentacene), or the like can be used.

For the gate insulating film 302b, a silicon oxide film, a silicon nitride film, a silicon oxide film including nitrogen, a silicon nitride film including oxygen, aluminum oxide, yttrium oxide, hafnium oxide, or the like can be used.

For the gate electrode 302c, titanium, molybdenum, tungsten, aluminum, copper, silver, gold, nickel, platinum, palladium, iridium, rhodium, tantalum, cadmium, zinc, iron, silicon, or the like can be used.

Note that the thin film transistor 302 in Embodiment 3 is a top-gate transistor; however, it may be a bottom-gate transistor. The semiconductor layer 302a may be provided with an LDD region as necessary.

The layer 303 including a resistor can be formed from a material similar to that of the semiconductor layer 302a. Moreover, the layer 303 including a resistor is preferably formed through the same steps as the semiconductor layer 302a because the number of steps can be decreased.

The layer 303 including a resistor is a semiconductor layer in Embodiment 3; however, the layer 303 including a resistor may be formed through the same steps as the gate electrode and then only the layer 303 including a resistor may be nitrided or oxidized. In the latter case, the layer 303 including a resistor is formed over the gate insulating film 302b.

As the interlayer insulating film 304, a silicon oxide film, a silicon nitride film, a silicon oxide film including nitrogen, a silicon nitride film including oxygen, a resin film, or the like can be used.

For the wirings 305a to 305d, titanium, molybdenum, tungsten, aluminum, copper, silver, gold, nickel, platinum, palladium, iridium, rhodium, tantalum, cadmium, zinc, iron, silicon, or the like can be used.

Note that each of the base insulating film 301, the semiconductor layer 302a, the gate insulating film 302b, the gate electrode 302c, the layer 303 including a resistor, the interlayer insulating film 304, or the wirings 305a to 305d may have a single-layer structure or a stacked-layer structure.

As one example of Embodiment 3, the layer 303 including a resistor corresponds to a first conductive layer and the wirings 305c and 305d correspond to a second conductive layer.

Accordingly, the resistance value (or resistivity) of the wirings 305c and 305d is lower than that of the layer 303 including a resistor.

Moreover, after a semiconductor integrated circuit including the thin film transistor and the resistor is completed, the semiconductor integrated circuit is sealed with an insulator such as an epoxy resin or prepreg; thus, the semiconductor integrated circuit can be protected.

Further, in the case where the semiconductor integrated circuit is an active matrix display device, for example, the sealing is performed using a counter substrate and a sealing material.

Embodiment 4

As a modified example of Embodiment 3, the layer 303 including a resistor may include a plurality of first regions where the resistance value (or resistivity) is high and a plurality of second regions where the resistance value (or resistivity) is low.

In this case, the plurality of first regions may be serially connected to each other and part of the plurality of first regions and part of the plurality of second regions may be connected in parallel to each other.

That is to say, the first region corresponds to the first conductive layer (resistor) and the second region corresponds to the second conductive layer (wiring).

An example of a method for manufacturing this structure is described.

Figure 7A:
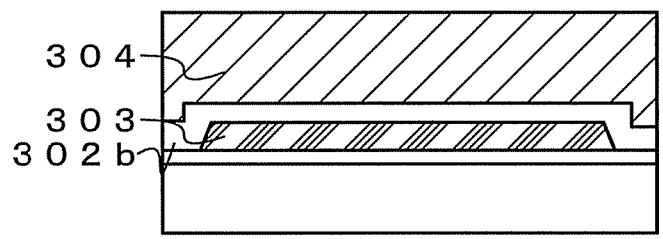
FIGS. 7A to 7C illustrate an example of a resistor.
Figure 7B:
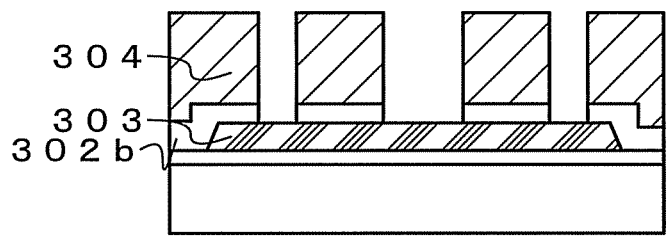
Figure 7C:
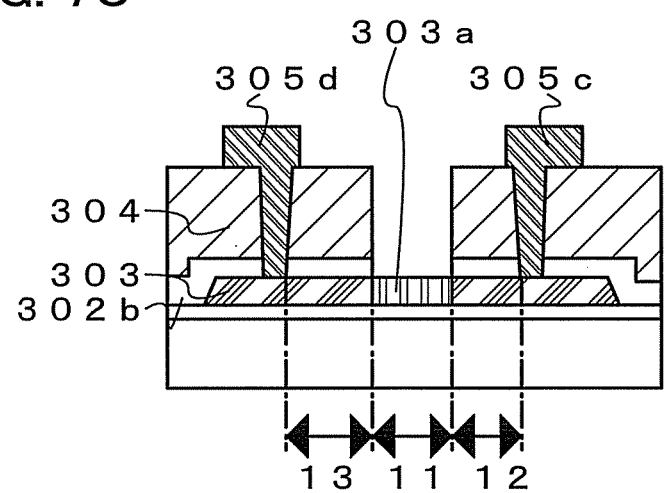

FIGS. 7A to 7C illustrate a region where the layer 303 including a resistor of FIG. 6 is formed.

FIG. 7A illustrates a state just after the formation of the interlayer insulating film 304.

In FIGS. 7A to 7C, a crystalline semiconductor is used for the layer 303 including a resistor.

Then, after the step of FIG. 7A, the interlayer insulating film 304 and the gate insulating film 302b are provided with contact holes that reach the layer 303 including a resistor and an opening that reaches the layer 303 including a resistor (FIG. 7B).

The opening is formed in a region that overlaps with a first region 11.

Further, the contact holes that reach the layer 303 including a resistor and the opening that reaches the layer 303 including a resistor are preferably formed at the same time as a contact hole that reaches the thin film transistor because the number of manufacturing steps can be decreased.

Next, the wirings 305c and 305d which are electrically connected to the layer 303 including a resistor through the contact holes that reach the layer 303 including a resistor are formed over the interlayer insulating film 304.

The wirings 305c and 305d are formed in such a manner that a conductive film is formed over the interlayer insulating film, a mask is formed over the conductive film, and then the conductive layer is etched using the mask.

As the mask, an organic film mask of a photoresist or the like is used. Alternatively, an inorganic film mask of a silicon oxide film, a silicon nitride film, a metal film, or the like may be used.

Next, an impurity which does not impart a conductivity type is added to the layer 303 including a resistor, which is exposed at the opening, whereby the crystalline semiconductor is destroyed. Thus, a non-crystalline semiconductor region 303a is thinned (FIG. 7C).

As the impurity which does not impart a conductivity type, hydrogen, a rare gas (such as helium or argon), or the like can be used.

In the aforementioned manner, the first region 11 which includes an amorphous semiconductor, and a second region 12 and a third region 13 which include the crystalline semiconductor can be formed individually. Note that only a surface of the semiconductor layer may be oxidized or nitrided by oxygen plasma treatment or nitrogen plasma treatment, instead of adding the impurity which does not impart a conductivity type. When only the surface of the semiconductor layer is oxidized or nitrided, the resistance value increases because the thickness of the semiconductor layer decreases. Note that heat treatment in an oxygen atmosphere or a nitrogen atmosphere may be performed instead of the plasma treatment.

Further, a metal layer (such as a metal layer formed through the same steps as the gate electrode) may be used for the layer 303 including a resistor.

In this case, only a surface of the metal layer is preferably oxidized or nitrided by oxygen plasma treatment or nitrogen plasma treatment. Heat treatment in an oxygen atmosphere or a nitrogen atmosphere may be performed instead of the plasma treatment. Since metal nitride or metal oxide has conductivity, the metal layer may be entirely nitrided or oxidized.

It is preferable to form the layer including a resistor over the gate insulating film (insulating surface), form the interlayer insulating film over the layer including a resistor, form the contact holes that reach the layer including a resistor and the opening that reaches the layer including a resistor in the interlayer insulating film, form the conductive film over the interlayer insulating film, form the mask over the conductive film, and oxidize or nitride the layer including a resistor, which is exposed at the opening, while the mask remains, because the wirings are protected with the mask.

In particular, it is preferable to perform oxygen plasma treatment while the photoresist mask remains, because the layer including a resistor can be oxidized at the same time as the photoresist is removed.

Embodiment 5

The semiconductor integrated circuit is provided with a resistor for the purpose of operating the circuit as desired.

However, when manufacture of the semiconductor integrated circuit is completed, the characteristics of an element (particularly, the characteristics of a thin film transistor) vary in some cases due to an uncertain factor (impurity contamination, dimensional error at the time of the photoresist light-exposure, or the like) in the manufacturing steps.

Therefore, due to the variation in characteristics of the element, there is a concern that the semiconductor integrated circuit does not operate as desired at the resistance value estimated at the time of the circuit design.

Consequently, the resistor group is formed as a variable resistor element according to the method of any of Embodiments 1 to 4. Thus, the resistance value can be adjusted afterward.

Embodiment 6

In the methods described in Embodiments 1 to 5, the wiring connected in parallel to part of the plurality of resistor units connected serially to each other is physically disconnected.

A fuse element, a switching element (such as a transistor), or the like may be interposed between the wirings connected in parallel to part of the plurality of resistor units connected serially to each other.

The fuse element needs to be provided with a fuse region which has smaller thickness than other regions in the wirings. For the fuse element, a wiring with low resistivity, or the like can be used. For the wiring, a semiconductor, metal, or the like can be used. In order to melt down the wiring with less heat generation, the width of the wiring is made as narrow as possible, preferably 1 μm or less.

When a large amount of current is applied to the region which has smaller thickness than other regions, the fuse region is fused and disconnected, so that current does not flow through the wiring.

In the case of using the switching element, the resistor can be made variable by turning on or off the switch. The use of the switching element is excellent in that the resistance can be changed many times.

On the other hand, in consideration of the necessity of the wirings for operating the switching, the structure where the wiring is disconnected is superior.

In particular, when it is considered that the disconnection is possible after the sealing, a structure in which laser cutting is performed, a structure in which a fuse element is used, or the like is superior.

Each structure has good points and bad points; therefore, the structure is preferably selected as appropriate in accordance with the purpose.

This application is based on Japanese Patent Application serial no. 2008-245124 filed with Japan Patent Office on Sep. 25, 2008, the entire contents of which are hereby incorporated by reference.

EXPLANATION OF REFERENCE

11: FIRST REGION, 12: SECOND REGION, 13: THIRD REGION, 101: METAL LAYER, 102: SILICON LAYER, 103: CONDUCTOR, 104: START POINT, 105: END POINT, 106: CONDUCTOR, 107: FIRST RESISTOR UNIT, 108: SECOND RESISTOR UNIT, 109: RESISTOR, 110: RESISTOR, 111: RESISTOR, 112: RESISTOR, 113: RESISTOR, 114: POSITION WHICH WILL BE IRRADIATED WITH LASER BEAM, 116: PARALLEL RESISTOR UNIT, 117: PARALLEL RESISTOR UNIT, 118: PARALLEL RESISTOR UNIT, 119: POSITION WHICH WILL BE IRRADIATED WITH LASER BEAM, 120: START POINT, 121: END POINT, 300: SUBSTRATE, 301: BASE INSULATING FILM, 302: THIN FILM TRANSISTOR, 303: LAYER INCLUDING A RESISTOR, 304: INTERLAYER INSULATING FILM, 302A: SEMICONDUCTOR LAYER, 302B: GATE INSULATING FILM, 302C: GATE ELECTRODE, 305A: WIRING, 305B: WIRING, 305C: WIRING, AND 305D: WIRING.

The invention claimed is:

1. A semiconductor device comprising:
a first metal layer, a second metal layer, a third metal layer, a fourth metal layer and a fifth metal layer, each provided in a first direction; and
a first resistor, a second resistor, a third resistor, a fourth resistor and a fifth resistor, each provided in a second direction orthogonal to the first direction,
wherein a part of the first metal layer is connected to one end of the first resistor, the other end of the first resistor is connected to a first part of the second metal layer, a second part of the second metal layer is connected to one end of the second resistor, the other end of the second resistor is connected to a first part of the third metal layer, a second part of the third metal layer is connected to one end of the third resistor, the other end of the third resistor is connected to a first part of the fourth metal layer, a second part of the fourth metal layer is connected to one end of the fourth resistor, the other end of the fourth resistor is connected to a first part of the fifth metal layer, a second part of the fifth metal layer is connected to one end of the fifth resistor, and the other end of the fifth resistor is connected to a third part of the third metal layer.

2. The semiconductor device according to claim 1, wherein an impurity in the first to fifth resistors is selected from the group of phosphorus, arsenic and boron.

3. The semiconductor device according to claim 1, wherein the first to fifth resistors have lower crystallinity than the first to fifth metal layers.

4. The semiconductor device according to claim 1, wherein a resistivity of the first to fifth resistors is 100 times or more than a resistivity of the first to fifth metal layers.

5. The semiconductor device according to claim 1, wherein a portion of the third metal layer is configured to be disconnected.

6. A semiconductor device comprising:
a substrate;
a first metal layer, a second metal layer, a third metal layer, a fourth metal layer and a fifth metal layer over the substrate, each provided in a first direction; and
a first resistor, a second resistor, a third resistor, a fourth resistor and a fifth resistor, each provided in a second direction orthogonal to the first direction,
wherein a part of the first metal layer is connected to one end of the first resistor, the other end of the first resistor is connected to a first part of the second metal layer, a second part of the second metal layer is connected to one end of the second resistor, the other end of the second resistor is connected to a first part of the third metal layer, a second part of the third metal layer is connected to one end of the third resistor, the other end of the third resistor is connected to a first part of the fourth metal layer, a second part of the fourth metal layer is connected to one end of the fourth resistor, the other end of the fourth resistor is connected to a first part of the fifth metal layer, a second part of the fifth metal layer is connected to one end of the fifth resistor, and the other end of the fifth resistor is connected to a third part of the third metal layer, and
wherein the substrate is selected from the group of a glass substrate, a quartz substrate, a resin substrate, and a metal substrate.

7. The semiconductor device according to claim 6, wherein the first to fifth resistors have lower crystallinity than the first to fifth metal layers.

8. The semiconductor device according to claim 6, wherein a resistivity off the first to fifth resistors is 100 times or more than a resistivity of the first to fifth metal layers.

9. The semiconductor device according to claim 6, wherein a portion of the third metal layer is configured to be disconnected.

* * * * *

UNITED STATES PATENT AND TRADEMARK OFFICE
CERTIFICATE OF CORRECTION

PATENT NO. : 9,960,116 B2
APPLICATION NO. : 12/563608
DATED : May 1, 2018
INVENTOR(S) : Ohshima Page 1 of 1

It is certified that error appears in the above-identified patent and that said Letters Patent is hereby corrected as shown below:

In the Claims

-- Claim 8, Column 10, Line 53: delete "off" and insert -- of --.

Signed and Sealed this
Fourteenth Day of August, 2018

Andrei Iancu
*Director of the United States Patent and Trademark Office*